United States Patent
Zeng

(10) Patent No.: US 9,374,079 B2
(45) Date of Patent: Jun. 21, 2016

(54) LEVEL JUMP RESET IC DESIGN CIRCUIT

(71) Applicant: GUANG DONG OPPO MOBILE TELECOMMUNICATIONS CORP., LTD, Guangdong (CN)

(72) Inventor: Yuanqing Zeng, Guangdong (CN)

(*) Notice: Subject to any disclaimer, the term of this patent is extended or adjusted under 35 U.S.C. 154(b) by 131 days.

(21) Appl. No.: 14/356,170

(22) PCT Filed: May 6, 2013

(86) PCT No.: PCT/CN2013/075220
§ 371 (c)(1),
(2) Date: May 5, 2014

(87) PCT Pub. No.: WO2014/040421
PCT Pub. Date: Mar. 20, 2014

(65) Prior Publication Data
US 2014/0308994 A1    Oct. 16, 2014

(30) Foreign Application Priority Data
Sep. 12, 2012  (CN) .......................... 2012 1 0334234

(51) Int. Cl.
*H03K 17/22*       (2006.01)
*H04M 1/02*        (2006.01)

(52) U.S. Cl.
CPC .............. *H03K 17/22* (2013.01); *H04M 1/0202* (2013.01)

(58) Field of Classification Search
None
See application file for complete search history.

(56) References Cited

U.S. PATENT DOCUMENTS

2010/0331046 A1* 12/2010 Li et al. ................ 455/556.2

OTHER PUBLICATIONS

Riccoh, R3200x series, 2011, https://www.google.com/search?q=R3200K001B&biw=1920&bih=1081&source=Int&tbs=cdr%3A1%2Ccd_min%3A%2Ccd_max%3A9%2F11%2F2012&tbm= http://www.aeneas.com.cn/PDF/Ricoh/r3200-e.pdf.*
Sirius, Input programming activity, 2009 http://www.siriusmicro.com/wand/input.html.*
Wikipedia, Diode—transistor logic, 2011 https://web.archive.org/web/20110401205300/http://en.wikipedia.org/wiki/Diode%E2%80%93transistor_logic.*

* cited by examiner

*Primary Examiner* — Ping Hsieh
*Assistant Examiner* — James Yang
(74) *Attorney, Agent, or Firm* — Prakash Nama; Global IP Services, PLLC

(57) ABSTRACT

A level jump reset IC design circuit is provided, comprising a reset IC, a reset circuit, and a switching circuit. The reset circuit and the switching circuit both are connected to signal input pins of the reset IC. The level jump reset IC design circuit can make mobile phones effectively realize reset shutdown and restart, and make the mobile phones enter a Recovery model. Reset pulse time can be set by a user according to requirements, so that the user can distinguish two different operations of reset shutdown and restart. When the model phones enter the Recovery model, the switching circuit deactivates the reset circuit, so the mobile phones can enter the Recovery mode normally and effectively.

10 Claims, 1 Drawing Sheet

LEVEL JUMP RESET IC DESIGN CIRCUIT

BACKGROUND OF THE INVENTION

The invention relates to a level jump reset IC design circuit, specifically to a circuit capable of making mobile phones realize reset shutdown and restart and making the mobile phones enter a Recovery mode.

Current smart phones usually crash due to frequent operation by users. In such circumstances, the users can only restart the smart phones through removing and re-installing the batteries, but the built-in batteries of the smart phones cannot be removed. To solve the mentioned problem, designers configure built-in hardware reset circuits on the smart phones, meaning that the mobile phones can be shut down and restarted through holding the power key for enough time after the mobile phones crash. The users hope that, when holding the power key, the mobile phones realize reset shutdown first and then restart. In this way, the users can realize shutdown or restart through pressing the power key at any time using the mobile phones.

Usually, reset ICs for pulse output (such as CAT871) are the first choice of designers. This kind of IC, without a peripheral circuit, can realize shutdown or restart through holding the power key and effectively distinguish reset and other operations. However, due to the too short pulse width time (2 ms-80 ms, the time is fixed by the IC and cannot be set manually), namely too short of a failure time of the reset circuit after shutdown, the users restart the mobile phones in a very short time after reset shutdown of the mobile phones. Thus, the users fail to effectively distinguish the two operations of reset shutdown and restart. In addition, this kind of ICs, without a peripheral circuit, cannot distinguish the reset operation and other operations, for example, entering the Recovery mode. With the peripheral circuit, the reset IC for level jump usually can only realize reset shutdown, and cannot realize restart.

BRIEF SUMMARY OF THE INVENTION

To overcome defects and problems of the prior art, the invention provides a level jump reset IC design circuit. The circuit resets IC using level jump. With a simple peripheral circuit, the mobile phones can effectively realize reset shutdown and restart and enter a Recovery mode.

The following technical scheme realizes the invention: A level jump reset IC design circuit comprises a reset IC, a reset circuit and a switching circuit. The reset IC has at least two signal input pins SR0 and SR1 and a signal output pin RST. The signal output pin RST outputs the corresponding signals according to the input signals of the signal input pin SR0 and the signal input pin SR1. The reset circuit is connected with the signal input pin SR0 of the reset IC such that the signal output pin RST of the reset IC outputs corresponding signals to realize reset shutdown of mobile phones. The switching circuit is connected with the signal input pin SR1 of the reset IC to control the reset circuit be at the state of effective reset or at the state of ineffective reset. Thus, the mobile phones realize restart and enter a Recovery mode.

Furthermore, the switching circuit comprises a triode Q1 and a diode D1. An emitter E of the triode Q1 is grounded, a base B thereof connected with a voltage source VCC1 through a pull-up resistor R1, a collector C thereof connected with a voltage source VCC2 through a pull-up resistor R2 and the signal input pin SR1 of the reset IC through a resistor R3. The positive electrode of the diode D1 is connected with the base B of the triode Q1, while the negative electrode thereof is connected with a key of a mobile phone. The voltage of the voltage source VCC1 of the switching circuit disappears along with reset shutdown of the mobile phone, while that of the voltage source VVC2 of the switching circuit always exists and does not disappear along with the reset shutdown of the mobile phone. The key is a volume-up key or a volume-down key or a camera key of the mobile phone. When the mobile phone is powered on, the key is of low level when pressed and of high level if not pressed.

Furthermore, the reset circuit comprises a power key PWR of the mobile phones; one end of the power key PWR is grounded, while the other end is connected with the signal input pin SR0 of the reset IC through a current limiting resistor R4 and connected with the voltage source VCC4 through a pull-up resistor R5.

Furthermore, the reset IC is a level jump reset IC of RICOH R3200x series. The triode Q1 is a NPN type triode.

When the reset circuit makes the mobile phone carry out reset shutdown, the shutdown of the mobile phone activates the switching circuit to output corresponding signals, and then the reset circuit is at the state of ineffective reset. If the power key PWR in the rest circuit is pressed continuously, the mobile phone restarts. If the key (such as volume-down key VOL-) connected with the switching circuit is pressed, the reset circuit enters the state of ineffective reset. In such circumstance, if the power key PWR in the reset circuit is pressed and software is used to detect if the power key PWR and the volume-down key VOL- are pressed at the same time, the software controls the mobile phone to enter the Recovery mode.

The level jump reset IC design circuit can make the mobile phones effectively realize reset shutdown and restart, and make the mobile phones enter the Recovery model. Reset pulse time (namely the time between shutdown and restart) can be set by a user, so that the user can distinguish two different operations of reset shutdown and restart. Meanwhile, when the model phones enter the Recovery model, the switching circuit deactivates the reset circuit, so the mobile phones can be controlled to enter the Recovery mode normally and effectively if the software detects that the volume-down key VOL- and the power key PWR are pressed at the same time.

DETAILED DESCRIPTION OF THE INVENTION

To be better understood by those skilled in this field, the invention is described in further detail with reference to the attached drawings and the embodiments in combination.

Figure 1:
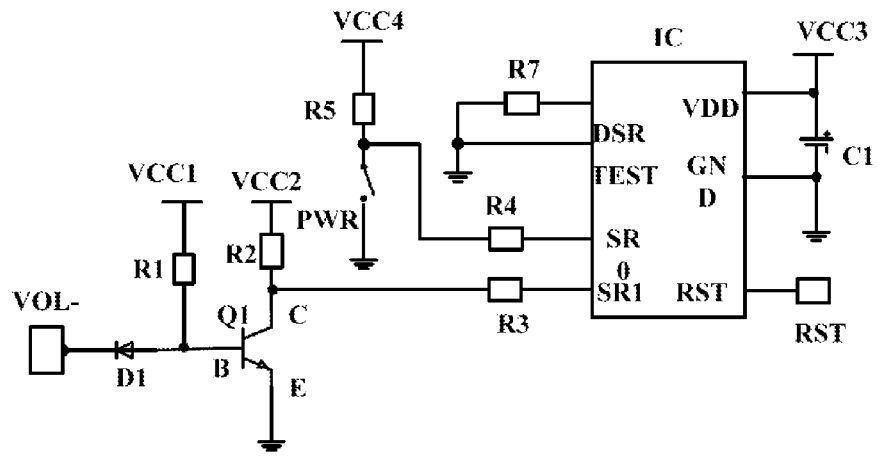
FIG. 1 is a schematic view of the circuit in the embodiment of the invention.

As shown in FIG. 1, a level jump reset IC design circuit comprises a reset IC, a reset circuit and a switching circuit. The reset IC is a level jump reset IC of RICOH R3200x series. In this embodiment, the model of the reset IC is R3200K001B. The reset circuit is connected with a signal input pin SR0 of the reset IC such that a signal output pin RST of the reset IC outputs corresponding signals to realize reset shutdown of mobile phones. The switching circuit is connected with a signal input pin SR1 of the reset IC to control the reset circuit be at the state of effective reset and at the state of ineffective reset, and thus the mobile phones realize restart and enter a Recovery mode. A power input pin VDD of the reset IC is connected with a voltage source VCC3, while a ground pin GND is grounded. A capacitor C1 is located between and in connection with the power input pin VDD and the ground pin GND. The other signal output pin of the reset IC is hung in the air (not shown in FIG. 1). A DSR pin of the reset IC is a select pin for reset delay time (namely an interval from the time when the signal input pin SR0 and the signal input pin SR1 meet the reset conditions at the same time to the time when the reset signal is output)-when the pin DSR is grounded, the reset delay time is 7.5S: when the DSR pin is connected with the power input pin VDD, the reset delay time is 11.25S. In this embodiment, the pin DSR is grounded through a resistor R7, namely the reset delay time is 7.5S. A TEST pin of the reset IC is a chip test pin, which is required to be grounded when the reset IC is working.

The switching circuit comprises a triode Q1 and a diode D1. The triode Q1 is an NPN type triode. An emitter E of the triode Q1 is grounded, a base B thereof connected with a voltage source VCC1 through a pull-up resistor R1, a collector C thereof connected with a voltage source VCC2 through a pull-up resistor R2 and the signal input pin SR1 of the reset IC through a resistor R3. The positive electrode of the diode D1 is connected with the base B of the triode Q1, while the negative electrode thereof is connected with the volume-down key VOL- of a mobile phone. When the mobile phone is powered on, the key is of low level when pressed and of high level if not pressed. The voltage of the voltage source VCC1 of the switching circuit disappears along with reset shutdown of the mobile phone, while that of the voltage source VCC2 of the switching circuit always exists and does not disappear along with the reset shutdown of the mobile phone. It should be noted that the negative electrode of the diode D1 in the switching circuit is not limited to be connected with the volume-down key VOL- of the mobile phone, and can also be connected with the volume-up key or camera key of the mobile phone. In this embodiment, only the volume-down key VOL is used as an example to describe the working principle of the invention.

The reset circuit comprises a power key PWR of the mobile phones; one end of the power key PWR is grounded, while the other end is connected with the signal input pin SR0 of the reset IC through a current limiting resistor R4 and connected with the voltage source VCC4 through a pull-up resistor R5.

The following are further description of the working principle of the invention.

Figure 2:
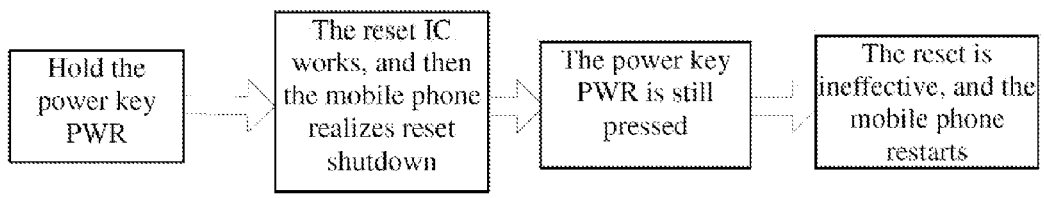
FIG. 2 is a working flowchart of reset shutdown and restart of a mobile phone in the embodiment of the invention.

After the mobile phone is powered on, the volume-down key VOL- and the power key PWR both are of high level if not pressed, and of low level if pressed. If not pressed, the volume-down key VOL- is of high level. The diode D1 is switched off. The triode Q1 is switched on, and the level of the elector C thereof is lowered. The signal input pin SR1 of the reset IC is of low level, and the reset circuit is at the state of effective reset. At this moment, press the power key PWR for a period of time (approximately 7.5S) alone, then the signal output pin RST of the reset IC outputs high level such that the mobile phone realizes reset shutdown. When the mobile phone realizes reset shutdown, the voltage source VCC1 of the base B of the triode Q1 of the switching circuit disappears. The triode Q1 is switched off. The signal input signal SR1 of the reset IC is pulled to be of high level by the voltage source VCC2 (voltage of the voltage sources VCC2, VCC3, VCC4 always exists, and cannot disappear along with shutdown of the mobile phone), and then the reset circuit is at the state of ineffective reset. In such circumstance, hold the power key PWR, and then the mobile phone realizes restart. Thus, holding the power key PWR makes the mobile phone realize reset shutdown and restart in succession. The working flowchart can be seen in FIG. 2. In addition, the reset pulse time (the time between shutdown and restart of the mobile phone) can be adjusted according to demands. Changing the resistance of the pull-up resistor R1 can adjust the reset pulse time, so the users can well distinguish the two different operations of reset shutdown and restart.

Figure 3:
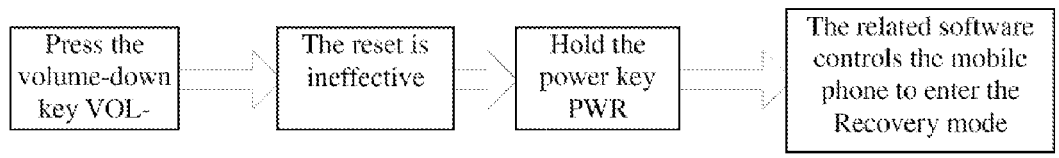
FIG. 3 is a working flowchart of a mobile phone entering the Recovery mode in the embodiment of the invention.

As long as the mobile phone enters the Recovery mode (the mobile phone must be shut down), press the volume-down key VOL- first and then hold the power key PWR. When related software is used to detect if the volume-down key VOL key and the power key PWR are pressed at the same time, the mobile phone is controlled through the software to enter the Recovery mode. When the volume-down key VOL- is pressed, the following occur: the volume-down key VOL- is grounded and turns to a low level; the diode D1 is switched on; the base B of the triode Q1 is grounded through the diode D1: the voltage at the base B of the triode Q1 is reduced to a low level; the triode Q1 is switched off; the signal input pin SR1 of the reset IC is pulled up to become a high level by the voltage source VCC2, and the reset circuit is at the state of ineffective reset. In such circumstances, if the power key PWR is held for a while and the software detects that the volume-down key VOL- and the power key PWR are pressed at the same time, then the mobile phone will smoothly enter the Recovery mode and avoid the situation of reset shutdown. The working flowchart can be seen in FIG. 3.

The above embodiment is just a preferable embodiment of the invention and cannot be regarded as limit of the invention. Without departing from the inventive concept of the present invention, any substitution falls within the protective scope of the invention.

What is claimed is:

1. A level jump reset IC design circuit, which is configured for a mobile phone, characterized by comprising:

a reset IC, having at least two signal input pins SR0 and SR1 and a signal output pin RST;

a reset circuit coupled to the signal input pin SR0 of the reset IC; and, a switching circuit coupled to the signal input pin SR1 of the reset IC to control the reset circuit to switch between a state of effective reset and a state of ineffective reset;

wherein the switching circuit comprises a triode Q1 and a diode D1, an emitter E of the triode Q1 is grounded, a base B of the triode Q1 is connected with a voltage source VCC1 through a pull-up resistor R1, a collector C of the triode Q1 is respectively connected with a voltage source VCC2 through a pull-up resistor R2 and the signal input pin SR1 of the reset IC through a resistor R3, and a positive electrode of the diode D1 is connected with the base B of the triode Q1, while a negative electrode of the diode D1 is connected with a key of the mobile phone;

wherein when the reset circuit is in the state of effective reset, the reset circuit can drive the reset IC to generate a first output signal for controlling the mobile phone to perform a reset shutdown function;

wherein the voltage of the source voltage VCC1 of the switching circuit disappears along with the reset shutdown of the mobile phone, while the voltage source VCC2 of the switching circuit is maintained and does not disappear along with the reset shutdown of the mobile phone, whereby the reset shutdown of the mobile phone can activate the switching circuit to switch the reset circuit from the state of effective reset into the state of ineffective reset; and wherein when the mobile phone is shutdown and the reset circuit is in the state of ineffective reset, the reset IC can selectively generate a second or third output signal at the signal output pin RST responsive to different input signals from the reset circuit and the switching circuit, the second output signal being configured for controlling the mobile phone to perform a restart function, and the third output signal being configured for controlling the mobile phone to enter a Recovery mode.

2. The level jump reset IC design circuit according to claim 1, characterized in that: the reset circuit is connected with a power key PWR of the mobile phone; one end of the power key PWR is grounded, while the other end of the power key is respectively connected with the signal input pin SR0 of the reset IC through a current limiting resistor R4 and connected with a voltage source VCC4 through a pull-up resistor R5.

3. The level jump reset IC design circuit according to claim 2, characterized in that the triode Q1 is a NPN type triode.

4. The level jump reset IC design circuit according to claim 2, wherein the key of the mobile phone which is connected with the negative electrode of the diode D1 is a volume-down key, when the mobile phone is powered on, the switching circuit generates a high logic level if the volume-down key is pressed and a low logic level if the volume-down key is not pressed, and the reset circuit generates a low logic level if the power key PWR is pressed and a high logic level if the power key PWR is not pressed.

5. The level jump reset IC design circuit according to claim 4, wherein when the volume-down key is not pressed, the switching circuit generates a low logic level and the reset circuit is in the state of effective reset, and then if the power key PWR is pressed for a predetermined time the reset circuit generates a low logic level to drive the reset IC to generate the first output signal for controlling the mobile phone to perform the reset shutdown function.

6. The level jump reset IC design circuit according to claim 5, wherein when the mobile phone is shutdown, the voltage source VCC1 of the base B of the triode Q1 disappears and the switching circuit generates a high Ionic level to switch the reset circuit from the state of effective reset into the state of ineffective reset, and if the power key PWR is held pressed during the reset shutdown of the mobile phone, and then the reset IC generates the second output signal for controlling the mobile phone to perform the restart function.

7. The level jump reset IC design circuit according to claim 5, wherein when the mobile phone is shutdown and the reset circuit is in the state of ineffective reset, the reset IC generates the third output signal for controlling the mobile phone to enter the Recovery mode if both of the volume-down key and the power key PWR are detected to be pressed at the same time.

8. The level jump reset IC design circuit according to claim 6, wherein the time span between the reset shutdown of the mobile phone and the restart of the mobile phone can be adjusted by changing the resistance of the pull-up resistor R1.

9. The level jump reset IC design circuit according to claim 1, wherein the reset IC comprises a DSR pin for resetting an interval from the time when the input signals from the reset circuit and the switching circuit simultaneously meet the reset conditions to the time when the reset IC generates the first output signal at the signal output pin RST.

10. The level jump reset IC design circuit according to claim 9, wherein the reset IC further comprises a power input pin VDD to be connected with a voltage source VCC3 and a ground pin GND to be grounded, and the interval is user-selectable options by connecting the DSR pin to either the ground pin GND or the power input pin VDD.

* * * * *